United States Patent
Joet (10) Patent No.: US 12,168,602 B2
(45) Date of Patent: Dec. 17, 2024

(54) METHOD FOR MANUFACTURING AN ELECTROACOUSTIC TRANSDUCER

(71) Applicant: COMMISSARIAT À L'ÉNERGIE ATOMIQUE ET AUX ÉNERGIES ALTERNATIVES, Paris (FR)

(72) Inventor: Loïc Joet, Grenoble (FR)

(73) Assignee: COMMISSARIAT À L'ENERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 502 days.

(21) Appl. No.: 17/487,871

(22) Filed: Sep. 28, 2021

(65) Prior Publication Data
US 2022/0098032 A1 Mar. 31, 2022

(30) Foreign Application Priority Data
Sep. 29, 2020 (FR) ...................................... 2009918

(51) Int. Cl.
| | | |
|---|---|---|
| B81C 1/00 | (2006.01) | |
| B81B 3/00 | (2006.01) | |
| H04R 19/00 | (2006.01) | |
| H04R 19/04 | (2006.01) | |
| H04R 31/00 | (2006.01) | |

(52) U.S. Cl.
CPC ........ B81C 1/00182 (2013.01); B81B 3/0021 (2013.01); H04R 19/005 (2013.01); H04R 19/04 (2013.01); H04R 31/003 (2013.01); B81B 2201/0257 (2013.01); B81B 2203/0127 (2013.01)

(58) Field of Classification Search
CPC ................ H04R 19/005; H04R 31/003; H04R 2201/003; H04R 31/00; H04R 7/24; H04R 19/02; B81C 1/00182; B81B 3/0021; Y10T 29/42; Y10T 29/49005
See application file for complete search history.

(56) References Cited

U.S. PATENT DOCUMENTS

| | | | | |
|---|---|---|---|---|
| 8,387,464 B2 * | 3/2013 | McNeil | ..................... | B81B 7/02 |
| | | | | 73/777 |
| 10,257,615 B2 * | 4/2019 | Joet | .......................... | H04R 7/24 |
| 10,807,858 B2 * | 10/2020 | Joet | ........................ | H04R 19/02 |

FOREIGN PATENT DOCUMENTS

| | | |
|---|---|---|
| EP | 2 541 222 A1 | 1/2013 |
| EP | 3 070 963 A1 | 9/2016 |
| EP | 3 557 881 A1 | 10/2019 |
| FR | 3 059 659 A1 | 6/2018 |

OTHER PUBLICATIONS

KR Search Report as issued in French Patent Application No. 2009918, dated Jun. 14, 2021.

* cited by examiner

Primary Examiner — Donghai D Nguyen
(74) Attorney, Agent, or Firm — Pillsbury Winthrop Shaw Pittman LLP (57) ABSTRACT

A method for manufacturing an electroacoustic transducer includes a frame; an element movable with respect to the frame, the movable element including a membrane and a structure for rigidifying the membrane; a first transmission arm, the movable element being coupled to an end of the first transmission arm; wherein the trimming of the membrane and the trimming of the rigidification structure are decorrelated in a region around an intersection between the position of the first transmission arm and the periphery of the rigidification structure.

12 Claims, 8 Drawing Sheets

METHOD FOR MANUFACTURING AN ELECTROACOUSTIC TRANSDUCER

CROSS-REFERENCE TO RELATED APPLICATIONS

This application claims priority to French Patent Application No. 2009918, filed Sep. 29, 2020, the entire content of which is incorporated herein by reference in its entirety.

FIELD

The technical field of the invention is that of devices of the microelectromechanical systems (MEMS) or nanoelectromechanical systems (NEMS) type. The invention relates more particularly to a method for manufacturing an electroacoustic transducer comprising a device for transmitting a movement and a force between two zones isolated from one another in a sealed manner. Such an electroacoustic transducer can be used as a microphone or loudspeaker.

BACKGROUND

Microelectromechanical or nanoelectromechanical microphones represent a growing market, in particular thanks to the development of nomad devices, such as tablets, Smartphones and other connected objects, wherein they are little by little replacing electret microphones.

Microphones measure a rapid variation in the atmospheric pressure, also called acoustic pressure. They therefore comprise at least one portion in contact with the exterior.

Most MEMS or NEMS microphones currently manufactured are capacitive detection microphones. Patent application FR3059659 describes an example of a capacitive detection microphone comprising a movable element, capacitive detection means and a device for transmitting a movement between the movable element and the capacitive detection means.

The movable element is capable of collecting the variation in pression. It can be formed by a rigid piston comprising a membrane, also called thin layer, and a structure for rigidifying the membrane. The membrane forms a separation between a cavity open onto the exterior environment and a rear volume of the microphone, also called reference volume because a reference pressure prevails therein. Thus, a face of the membrane is subjected to the reference pressure and an opposite face of the membrane is subjected to atmospheric pressure (of which it is desired to detect the variation). The movable element is connected to the movement transmitting device in a first zone of the microphone.

The capacitive detection means make it possible to measure the displacement of the piston, and therefore the variation in pressure. They are disposed in a second zone isolated from the first zone in a sealed manner. They comprise a movable electrode and at least one fixed electrode arranged facing the movable electrode. The electrodes form the armatures of a capacitor of which the capacitance varies according to the displacement of the piston. The second zone is a chamber under a controlled atmosphere (typically in a vacuum) in order to reduce the phenomena of viscous friction and the associated noises.

The transmitting device comprises at least one first transmission arm extending in the first zone and at least one second transmission arm extending in the second zone. The piston is coupled to a first end of the first transmission arm, while the movable electrode of the capacitive detection means is coupled to an end of the second transmission arm.

The first and second transmission arms are connected to their second end via a pivot articulation. This pivot articulation authorises a rotation of the transmission arms with respect to the frame of the microphone and simultaneously ensures the seal between the first and second zones.

The manufacturing of such a microphone comprises in particular a step of trimming the piston and a step of delimiting transmission arms, in order to render them movable with respect to the frame. These steps are difficult to implement without piercing the piston and creating substantial air leaks between the cavity subjected to atmospheric pressure and the rear volume of the microphone (subjected to the reference pressure).

SUMMARY

More generally, there is a need to manufacture an electroacoustic transducer while still eliminating the leaks of air between the different volumes of the electroacoustic transducer, the electroacoustic transducer comprising:
  a frame;
  an element movable with respect to the frame, the movable element comprising a membrane and a structure for rigidifying the membrane;
  a first transmission arm, the movable element being coupled to an end of the first transmission arm.

According to a first aspect of the invention, this need tends to be satisfied by providing a manufacturing method comprising the following steps:
  providing a stack comprising successively a substrate, a first sacrificial layer and a first structural layer;
  etching the first structural layer to the first sacrificial layer in such a way as to separate a first portion of the first structural layer and a second portion of the first structural layer, the first portion of the first structural layer being intended to form the membrane of the movable element;
  forming a second sacrificial layer comprising:
    a first portion arranged on the first portion of the first structural layer;
    a second portion spaced from the first portion and arranged on the first structural layer; and
    a third portion adjacent to the second portion and arranged on the first sacrificial layer between the first and second portions of the first structural layer;
  forming a second structural layer on the second sacrificial layer;
  etching the second structural layer in such a way as to delimit the rigidification structure of the movable element and in such a way as to expose the first portion of the second sacrificial layer; and
  etching the second sacrificial layer in such a way as to expose the first portion of the first structural layer.

Furthermore, the etching of the first structural layer and the etching of the second structural layer delimiting the periphery of the rigidification structure are spaced from one another in a region around the position of the first transmission arm, in such a way that the second portion of the second sacrificial layer serves as a stop layer to the etching of the second structural layer.

In the region where the first transmission arm and the periphery of the rigidification structure cross, the second portion of the second sacrificial layer covers the first structural layer. The first structural layer is then not affected by the etching of the second structural layer. Furthermore, by moving the etching of the first structural layer away from the etching of the second structural layer, the integrity of the first sacrificial layer can be preserved at the first transmission arm after the step of etching the second sacrificial layer. The substrate can then be etched in order to delimit the first transmission arm without the risk of the etching propagating to the first structural layer and to the second structural layer. The risk of creating air leaks on either side of the first transmission arm is then removed.

In an embodiment of the manufacturing method, the first structural layer is etched outside the region in such away that the third portion of the second sacrificial layer extends at least to the periphery of the rigidification structure.

The etching of the first structural layer and the etching of the second structural layer can be spaced from one another by means of an inset of the first structural layer and/or by means of an inset of the second structural layer.

The second portion of the second sacrificial layer can be arranged on the first portion of the first structural layer or on the second portion of the first structural layer.

The manufacturing method can furthermore comprise, after the step of etching the second sacrificial layer, the following steps:
  etching the substrate to the first sacrificial layer in such a way as to delimit the first transmission arm; and
  etching the first sacrificial layer in such a way as to render moveable the first portion of the first structural layer.

Beneficially, the manufacturing method further comprises, after the step of etching the second sacrificial layer and before the step of etching the substrate, the following steps:
  arranging a cover on the second structural layer, thus forming an assembly; and
  turning over the assembly.

In addition to the characteristics that have just been mentioned in the preceding paragraphs, the manufacturing method according to the invention can have one or more additional characteristics among the following, taken individually or in any technically permissible combination:
  the rigidification structure of the movable element rest at least in part on the first portion of the first structural layer;
  the rigidification structure of the movable element is in contact with the first portion of the first structural layer;
  the stack is a multilayer structure of the silicon-on-insulator (SOI) type;
  the substrate is made from silicon, the first sacrificial layer is made from silicon oxide and the first structural layer is made from silicon;
  the second sacrificial layer is made from silicon oxide; and
  the first structural layer has a thickness comprised between 100 nm and 10 µm.

A second aspect of the invention relates to an electroacoustic transducer comprising:
  a frame;
  an element movable with respect to the frame, the movable element comprising a membrane and a structure for rigidifying the membrane;
  a first transmission arm, the movable element being coupled to an end of the first transmission arm;
the membrane being formed by a first portion of a first structural layer, the rigidification structure being formed by a first portion of a second structural layer arranged on the first structural layer and the frame comprising a substrate, a second portion of the first structural layer and a second portion of the second structural layer,
one of the first and second portions of the first structural layer and/or one of the first and second portions of the second structural layer having an inset facing the other of the first and second portions, the inset being located in a region around an intersection between the position of the first transmission arm and the periphery of the rigidification structure.

In an embodiment, the transducer comprises a device for transmitting a movement and a force between a first zone and a second zone with a controlled atmosphere, the first and second zones being insulated from one another in a sealed manner, the transmitting device comprising, in addition to the first transmission arm that extends in the first zone, a second transmission arm extending in the second zone.

In an embodiment, the frame comprises a first portion of the substrate and the first transmission arm is formed from a second portion of the substrate.

The invention and its different applications will be understood better when reading the following description and when examining the accompanying figures.

BRIEF DESCRIPTION OF THE FIGURES

Other characteristics and benefits of the invention will become clear from the description that is given thereof below, for indicative purposes and in no way limiting, with reference to the appended figures, among which.

For increased clarity, identical or similar elements are marked with identical reference signs on all the figures.

DETAILED DESCRIPTION

Figure 1:
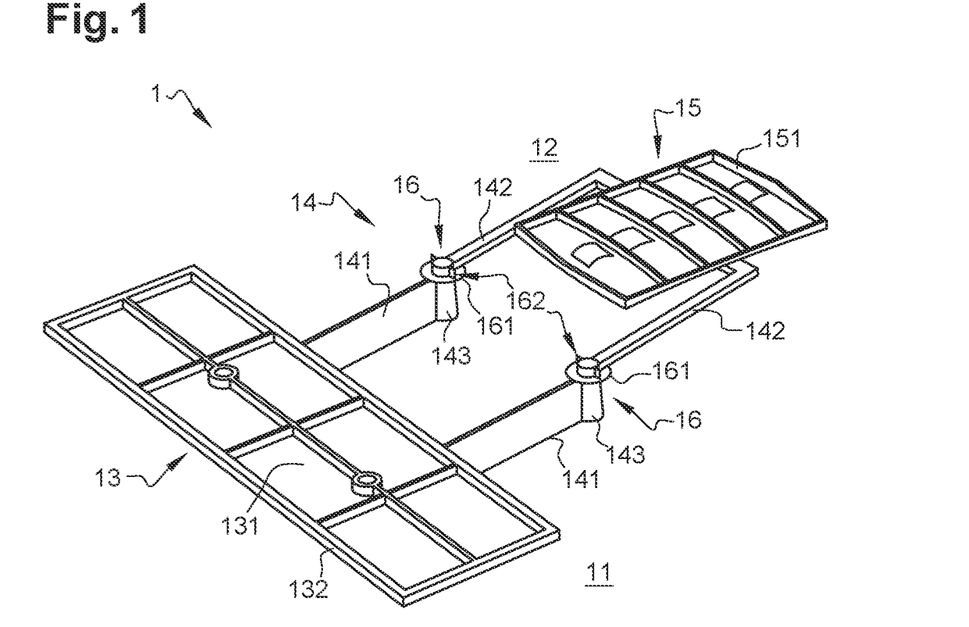
FIG. 1 schematically and partially shows an example of an electroacoustic transducer comprising a piston connected to two first transmission arms.

FIG. 1 shows an example of an electroacoustic transducer 1, of the capacitive detection microphone type, of which it is sought to simplify the manufacture.

The electroacoustic transducer 1 comprises a frame (not shown) delimiting at least partially a first zone 11 and a second zone 12, an element 13 movable with respect to the frame and a device 14 for transmitting a movement between the first zone 11 and the second zone 12. The first and second zones 11-12 of the electroacoustic transducer 1 are subjected to different pressures. They are isolated from one another in a sealed manner.

The movable element 13, called piston hereinafter, is in contact with the first zone 11. It comprises a membrane 131 and a structure 132 for rigidifying the membrane, also called skeleton or armature. The membrane 131 of the piston 13 here has for role to collect over the entire surface thereof a difference in pressure between its two faces, in order to deduce therefrom a variation in the atmospheric pressure.

The membrane 131 of the piston 13 delimits in part a closed volume referred to as reference volume, where a reference pressure prevails. It separates this reference volume from a cavity open onto the exterior environment, here the air. A face of the membrane 131 is therefore subjected to the reference pressure and an opposite face of the membrane 131 is subjected to atmospheric pressure (of which it is sought to detect the variation in the case of a microphone).

The first zone 11 can correspond to the cavity open onto the exterior environment, and therefore be subjected to the atmospheric pressure. Alternatively, the first zone 11 can be the reference volume subjected to the reference pressure.

Furthermore, in this particular example, the electroacoustic transducer 1 comprises a capacitive detection device 15 arranged in the second zone 12. The capacitive detection device 15 makes it possible to measure the displacement of the piston 13, and therefore the difference in pressure between its two faces. It desirably comprises a movable electrode 151 and at least one fixed electrode arranged facing the movable electrode 151. The electrodes form the armatures of a capacitor of which the capacitance varies according to the displacement of the piston 13.

The second zone 12 is a chamber under a controlled atmosphere in order to reduce the phenomena of viscous friction and the associated acoustic noises. The term "chamber under atmospheric pressure" means a chamber under a reduced pressure, typically less than 10 mbar, and desirably under vacuum.

The transmitting device 14 is mounted movable in rotation with respect to the frame, by means of one or more pivot articulations 16. The transmitting device 14 comprises at least one first transmission arm 141 extending in a first zone 11, at least one second transmission arm 142 extending in the second zone 12 and at least one transmission shaft 143 extending in part in the first zone 11 and in part in the second zone 12. In the example of FIG. 1, the transmitting device 14 comprises two first transmission arms 141, two second transmission arms 142 and two transmission shafts 143, each transmission shaft 143 connecting a first transmission arm 141 to a second transmission arm 142.

Each first transmission arm 141 comprises a first end coupled to the piston 13 and a second opposite end, coupled to the associated transmission shaft 143. Each second transmission arm 142 comprises a first end coupled to the movable electrode 151 of the capacitive detection device 15 and a second opposite end, coupled to the associated transmission shaft 143.

The transmission shaft 143 is for example in the form of a straight cylinder. The transmission arms 141-142 desirably have the form of a beam of rectangular section, with one dimension (length) much greater than the others (width and thickness). The piston 13 has for example a rectangular shape. The first transmission arms 141 extend desirably perpendicularly to a side of the piston 13, beneficially a large side. They can be anchored inside the periphery of the piston 13, such as shown in FIG. 1, for example by means of a first end of cylindrical shape.

Each pivot articulation 16 desirably comprises a sealed isolation element 161, passed through by a transmission shaft 143, and two aligned blades 162, which extend between the transmission shaft 143 and the frame. The sealed isolation element 161 is for example in the form of a sealing membrane. It ensures the sealing between the first zone 11 and the second zone 12 at the pivot articulation 16. The blades 162 are sized so as to be able to be deformed in torsion and allow for the rotation of the transmitting device 14. They are desirably disposed in a diametrically opposite manner in relation to the transmission shaft 143. In an embodiment, the sealed isolation element 161 is such that it is also deformed under the effect of the displacement in rotation of the transmitting device 14.

The frame can in particular comprise a support (formed by a first substrate), a structural layer (for example made of silicon) disposed on the support and a cover added on the structural layer (for example formed by a second substrate).

The structure 132 for rigidifying the membrane of the piston 13 beneficially comprises at its periphery an edge that extends in a direction perpendicular to the membrane 131. This edge increases the path of the air around the piston and reduces the leaks between the outside environment and the closed volume used as a reference.

FIGS. 2A to 2H show steps S1, S3 to S9 of a method for manufacturing the electrostatic transducer 1. These figures show in which way the piston 13 can be formed and detached from the frame. Only a portion of the electrostatic transducer, in the vicinity of the periphery of the piston 13, is therefore shown. With a concern for simplification, reference will be made to only a single first transmission arm 141, a single pivot articulation 16, a single sealing membrane 161 ..., with the understanding that all the elements of the same type can be formed simultaneously.

Figure 2A:
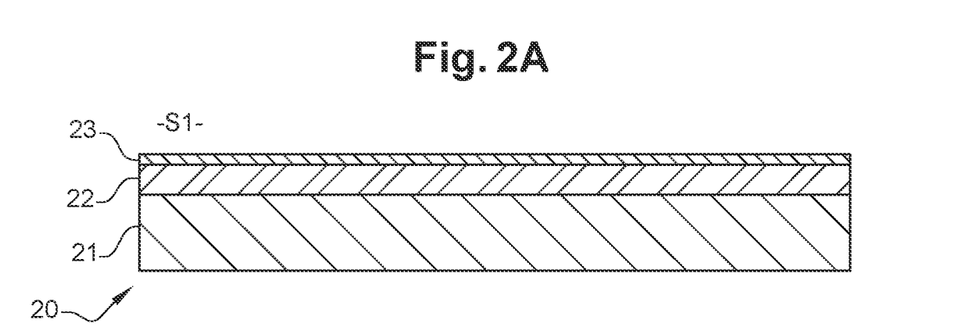
FIG. 2A to FIG. 2H shows steps of a method for manufacturing the electroacoustic transducer according to FIG. 1.

[FIG. 2A] The first step S1 shown in FIG. 2A consists of providing a stack of layers 20 used as a starting material in the creating of the transducer. The stack 20 successively comprises a substrate 21, a first sacrificial layer 22 and a first structural layer 23, also called "thin layer".

The substrate 21 is used in particular to produce the first transmission arm 141 and a portion of the frame (the support). It initially has a thickness that can be comprised between 500 μm and 700 μm. The substrate 21 can be made from a semiconductor material, for example silicon.

The first structural layer 23 is used to produce the membrane 131 of the piston 13. It can also be used to produce the sealing membrane 161 of the pivot articulation 16 and/or the movable electrode 151 of the capacitive detection device 15. It has a thickness less than that of the substrate 21, desirably comprised between 100 nm and 10 μm, for example equal to 1 μm. It is desirably formed from the same material as the substrate, for example silicon.

The first sacrificial layer 22 is intended to disappear in part during the production of the transducer. This layer is in particular useful for delimiting the first transmission arm 141. It can also be used as a lower airgap in the capacitive detection zone of the transducer. It can also make it possible to mechanically connect the substrate and the first structural layer. The first sacrificial layer 21 can be formed from a dielectric material, desirably a silicon nitride or a silicon oxide, for example silicon dioxide ($SiO_2$). Its thickness is for example comprised between 100 nm and 10 μm.

The stack 20 can in particular be a multilayer structure of the Silicon On Insulator (SOI) type, commonly called a SOI substrate.

Although not shown in the figures, the manufacturing method further comprises a step S2 of etching the first structural layer 23. This step of etching the first structural layer 23 can in particular be used to form holes for releasing the movable electrode 151 (in order to allow the etching solution of the first sacrificial layer 22 to infiltrate later).

Figure 2B:
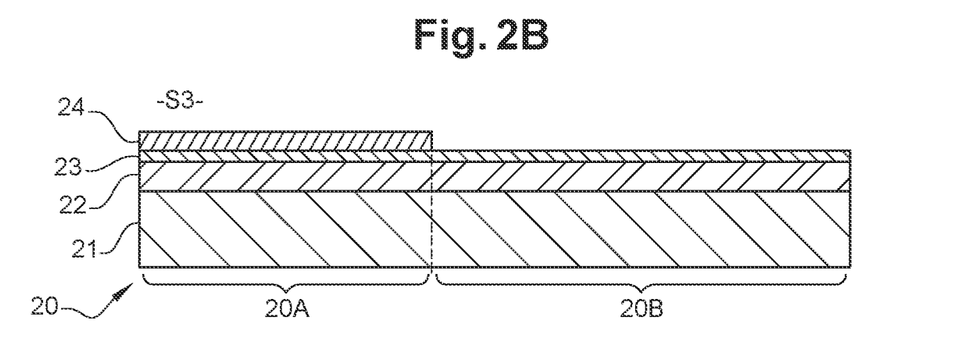

[FIG. 2B] At the step S3 of FIG. 2B, a second sacrificial layer 24 is formed on the first structural layer 23 in a first zone 20A of the stack 20. To do this, the second sacrificial layer 24 can first be deposited in such a way as to entirely cover the first structural layer 23 then partially etched in a second zone 20B of the stack 20, for example through a resin mask formed by photolithography. The etching of the second sacrificial layer 24 is desirably selective with respect to the first structural layer 23. The second sacrificial layer 24 is beneficially formed from the same dielectric material as the first sacrificial layer 22, for example a silicon oxide. Its thickness can be comprised between 100 nm and 10 µm.

The second sacrificial layer 24 can be used as an upper airgap for the capacitive detection. The etching of the second sacrificial layer 24 can result in the etching of the first sacrificial layer 22, where the first structural layer 23 was etched beforehand (not shown in the figures).

Figure 2C:
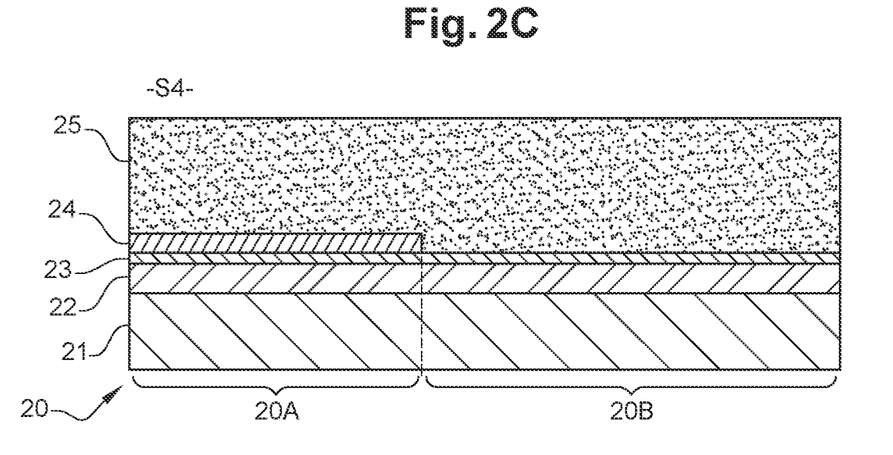

[FIG. 2C] At the step S4 of FIG. 2C, a second structural layer 25 is deposited on the first structural layer 23 (in the second zone 20B of the stack 20) and on the second sacrificial layer 24 (in the first zone 20A of the stack 20), for example by epitaxy. The second structural layer 25 is intended to form one or more (structural) elements of the transducer, in particular the rigidification structure 132 of the piston 13. It is beneficially formed from the same material as the first structural layer 23, for example silicon. The thickness of the second structural layer 25 is desirably comprised between 5 µm and 50 µm, for example equal to 20 µm.

Figure 2D:
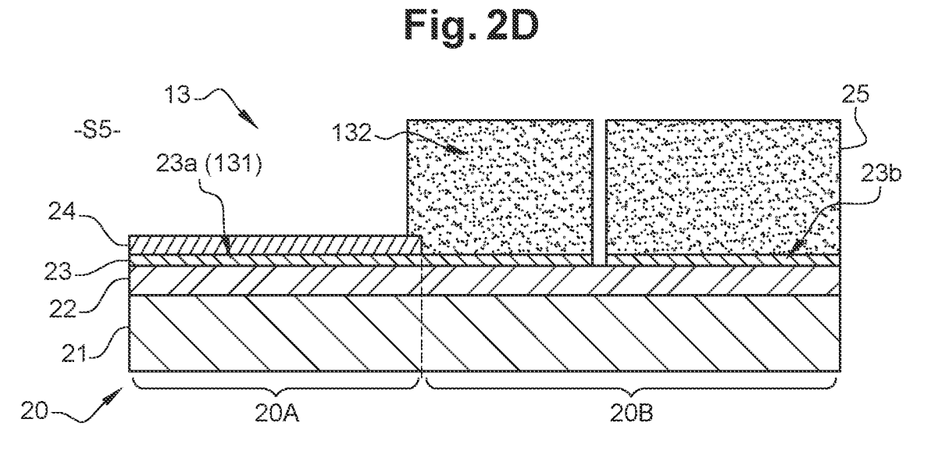

[FIG. 2D] Then, during a step S5 shown in FIG. 2D, the second structural layer 25 is etched in such away as to delimit the contours of the rigidification structure 132 (trimming of the piston) and to lighten the piston 13. In the first zone 20A of the stack 20, the second sacrificial layer 24 (ex. in silicon oxide) is used as a stop layer to the etching of the second structural layer 25 (ex. in silicon), thus preserving the first underlying structural layer 23 (ex. in silicon). The etching of the second structural layer 25 is therefore selective with respect to the second sacrificial layer 24. On the other hand, in the second zone 20B of the stack 20, the etching of the second structural layer 25 in order to delimit the periphery (or the exterior contour) of the rigidification structure 132 opens onto the first structural layer 23. As the etching of the second structural layer 25 is not selective with respect to the first structural layer 23 (but only with respect to the first sacrificial layer 22), the first structural layer 23 is etched at the same time as the second structural layer 25 to the first sacrificial layer 22.

Thus, at the bottom of the trench corresponding to the periphery of the rigidification structure 132, the first structural layer 23 was etched and the first sacrificial layer 22 is exposed.

At the end of step S5, the first structural layer 23 comprises a first portion 23a and a second portion 23b separated from one other. The first portion 23a of the first structural layer 23 (on the left in FIG. 2D) is intended to form the membrane 131 of the piston 13. It is covered by the second sacrificial layer 24 and by a detached portion of the second structural layer 25 forming the rigidification structure 132 of the piston 13.

The etching technique used in the step S5 of FIG. 2D is beneficially Deep Reactive Ion Etching (DRIE).

Figure 2E:
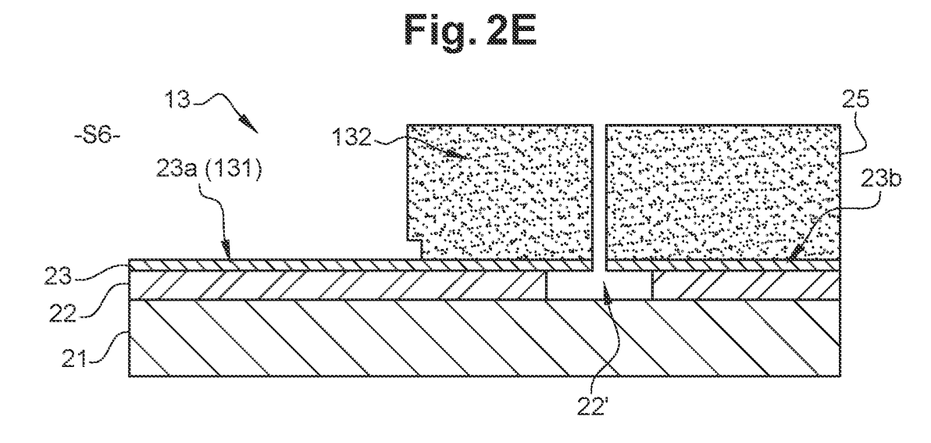

[FIG. 2E] In reference to FIG. 2E, the manufacturing method then comprises a step S6 of etching the second sacrificial layer 24 in such a way as to expose (partially) the first portion 23a of the first structural layer 23 (in other words in such a way as to expose a first face of the membrane 131). This step S6 can be qualified as a first step of releasing the piston 13.

The etching of the second sacrificial layer 24 is desirably an isotropic etching selective with respect to the substrate 21, to the first structural layer 23 and to the second structural layer 25. The second sacrificial layer 24 is desirably chemically etched, for example by immersing the stack is a bath of hydrofluoric acid (HF) in liquid or vapour phase (in the case of a silicon oxide layer) during a controlled time.

On the other hand, a portion of the first sacrificial layer 22 located in line with the periphery of the rigidification structure 132 is etched at the same time as the second sacrificial layer 24, which forms a cavity 22' in the first sacrificial layer 22. The etching can be controlled in time in such a way that this cavity 22' is very little extended.

The etching of the sacrificial layers 22 and 24 can also be used to release the movable electrode 151 of the capacitive detection device 15 (before it is enclosed in the chamber under a controlled atmosphere).

Although not shown in the figures, the manufacturing method can then comprise a step of transferring a cover on the second structural layer 25, thus forming the chamber under a controlled atmosphere, i.e. the second zone 12. The cover can be carried out by machining a silicon substrate. It can in particular be fixed to the second structural layer 25 by direct bonding (for example Si—Si) or by eutectic sealing (for example Au—Si).

[FIG. 2F] Then, in the step S7 of FIG. 2F, the assembly formed by the stack of layers 20 and the cover (not shown) is turned over, in order to facilitate the later etching of the substrate 21. After this turning over, the substrate 21 is beneficially thinned, for example by DRIE etching, grinding and/or chemical mechanical polishing (CMP), desirably until reaching a thickness comprised between 30 µm to 300 µm, which is the thickness desired for the first transmission arm 141.

Figure 2F:
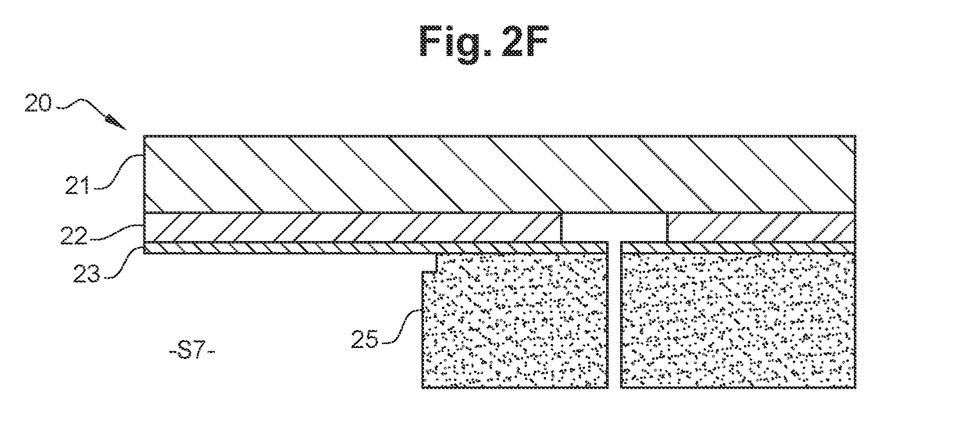
Figure 2G:
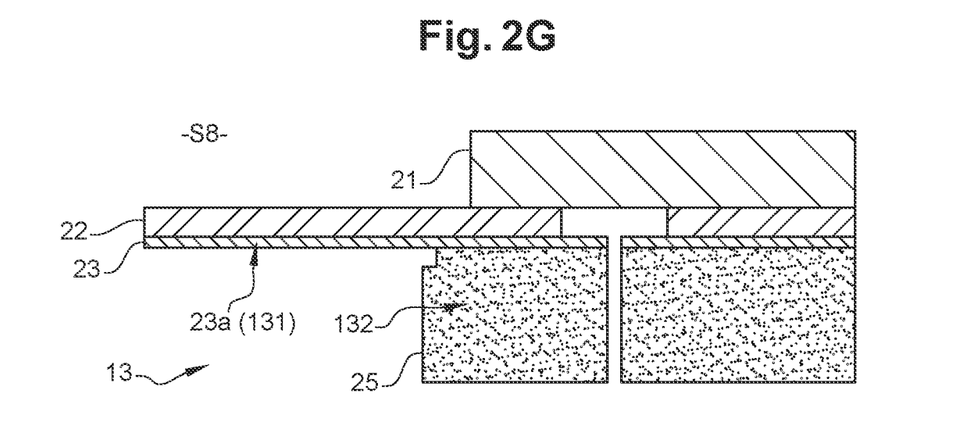

[FIG. 2G] The step S8 of FIG. 2G consists of etching the substrate 21 (optionally thinned) to the first sacrificial layer 22 in such a way as to create an access to the piston 13 and to delimit, in a zone not shown in FIG. 2F, the first transmission arm. The etching of the substrate is desirably selective with respect to the first sacrificial layer 22. The substrate 21 can be etched by DRIE.

Such as is shown in FIG. 2G, the etching of the substrate 21 in order to create an access to the rear face of the piston 13 can be inscribed inside the periphery of the piston 13, is such a way as to not open onto the cavity 22' formed in the step S6 (cf. FIG. 2E) by the partial (and involuntary) etching of the first sacrificial layer 22. Thus, the etching of the step S8 does not extend to the piston 13 comprising the first portion 23a of the first structural layer 23 (membrane 131) and the detached portion of the second structural layer 25 (rigidification structure 132). Inside the periphery of the piston 13, the first sacrificial layer 22 (ex. made from silicon oxide) is used as a stop layer to the etching of the substrate 21 (ex. made of silicon), thus preserving the first portion 23a of the first underlying structural layer 23 (ex. made of silicon).

Finally, in step S9 (cf. [FIG. 2H]), the first sacrificial layer 22 is etched in such a way as to expose the first portion 23a of the first structural layer 23 (in other words in such a way as to expose a second face opposite the membrane 131) and detach it from the substrate 21. At the end of step S9, the piston 13 is free to be displaced. The step S9 can therefore be qualified as a second step of releasing the piston 13.

Figure 2H:
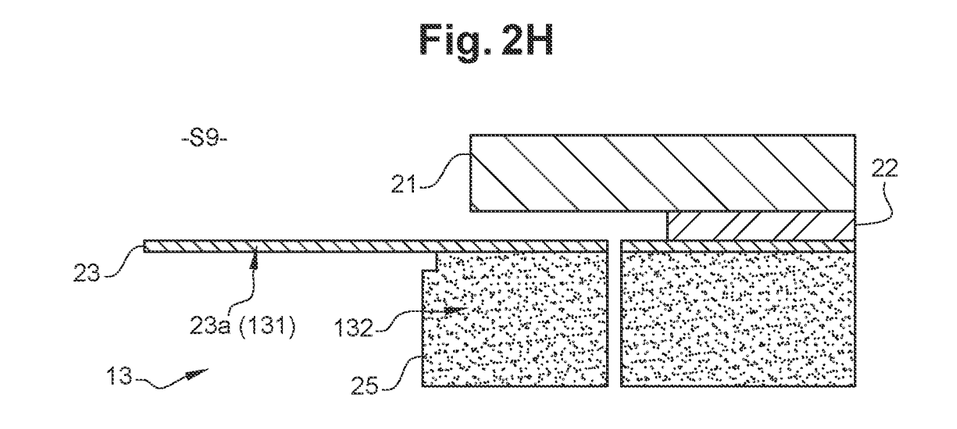

The etching of the first sacrificial layer 22 is desirably an isotropic etching selective with respect to the substrate 21, to the first structural layer 23 and to the second structural layer 25. The first sacrificial layer 22 is desirably chemically etched, for example by immersing the assembly in a bath of hydrofluoric acid (HF) in the liquid or vapour phase (in the case of a layer of silicon oxide) fora controlled time.

Figure 3:
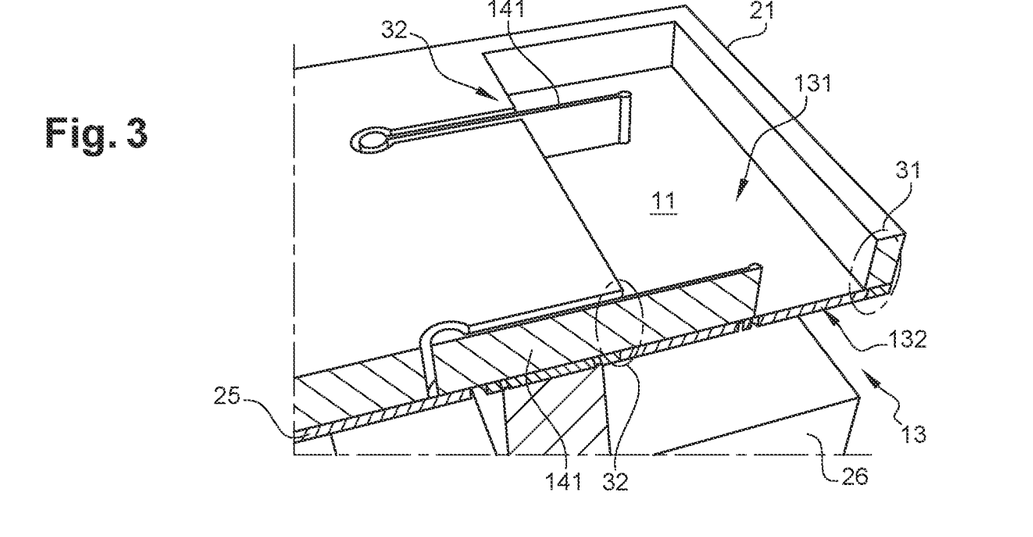
FIG. 3 is a perspective view of the electroacoustic transducer after the step of releasing the membrane of the piston shown in FIG. 2H.

FIG. 3 is a perspective view of the assembly after the second step S9 of releasing the piston (FIG. 2H), sectioned according to the plane of symmetry of a transmission arm 141. A portion of the cover 26 transferred onto the second structural layer 25 is shown therein.

The first region 31 located at the periphery of the rigidification structure 132 is that shown as a cross-section in FIG. 2H.

This figure shows that the vertical projection (i.e. perpendicular to the substrate) of the first transmission arm 141 traverse the periphery of the rigidification structure 132 of the piston 13. However, at the vertical of this periphery is the cavity 22' formed by the etching of the first sacrificial layer 22.

Thus, in a second region 32 of the stack around an intersection between the projection (or the position) of the first transmission arm 141 and the periphery of the rigidification structure 132, the etching of the substrate 21 coincides with the etching (undergone) of the first sacrificial layer 22. The first sacrificial layer 22 can therefore no longer be used as a stop layer to the etching of the substrate 21. This etching is not interrupted and extends to the first structural layer 23 and to the second structural layer 25. Such a phenomenon is problematic because it creates substantial air leaks between the first zone 11 located on a side of the first structural layer 23 and the volume located on the opposite side of the first structural layer 23 (here under the cover 26). This problem of leaks occurs naturally at each first transmission arm 141, when the transmitting device has several of them.

In order to overcome this problem, the steps S2, S3, S5 and S6 of the manufacturing method described hereinabove are accomplished in a different way, at least in the vicinity of each intersection between the projection of a first transmission arm 141 and the periphery of the rigidification structure 132.

FIGS. 4A to 4D show as a cross-section view in what way the steps S2, S3, S5 and S6 are implemented in each second region 32 (containing the intersection between the projection of a first transmission arm 141 and the periphery of the rigidification structure 132).

Figure 4A:
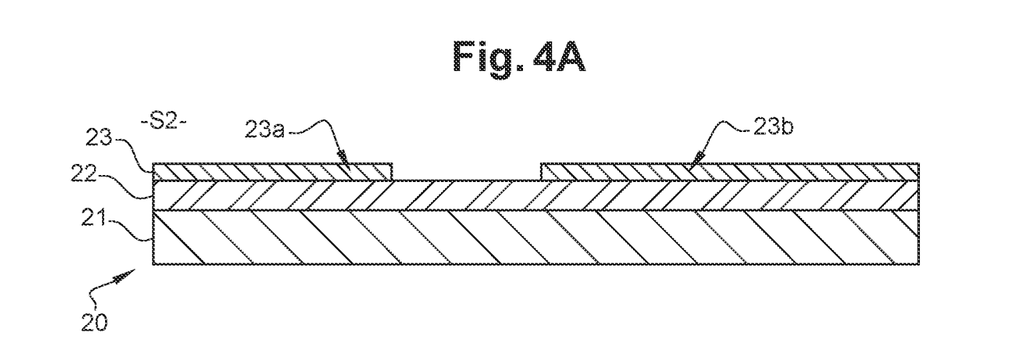
FIG. 4A to FIG. 4D shows steps of a method for manufacturing of an electroacoustic transducer according to the invention.

[FIG. 4A] FIG. 4A shows the step S2 of etching the first structural layer 23. A portion of the first structural layer 23 is etched in such a way as to separate, at least locally (i.e. in the second region 32), the first portion 23a and the second portion 23b of the first structural layer 23. As a reminder, the first portion 23a of the first structural layer 23 is intended to form the membrane 131 of the piston. Thus, the membrane 131 is at least partially trimmed during this step S2.

Figure 4B:
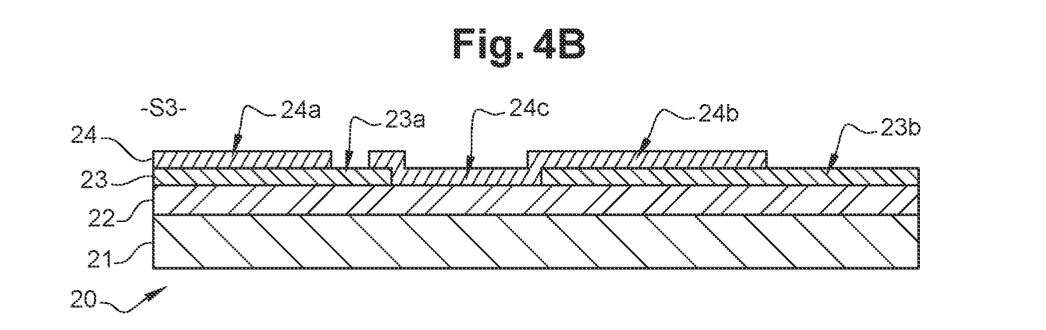

[FIG. 4B] Then, in the step S3 of FIG. 4B, the second sacrificial layer 24 is formed on the stack 20. The step S3 can be accomplished in such a way that the second sacrificial layer 24 comprises a first portion 24a arranged on the first portion 23a of the first structural layer 23 and a second portion 24b spaced from the first portion 24a. The second portion 24b of the second sacrificial layer 24 is deposited on the first structural layer 23 (here on the second portion 23b) and extends to the location where the first structural layer 23 was etched.

The second sacrificial layer 24 further comprises a third portion 24c arranged on the first sacrificial layer 22 between the first and second portions 23a-23b of the first structural layer 23 (at the location where the first structural layer 23 was etched). The third portion 24c is adjacent to the second portion 24b. It occupies all the space between the first and second portions 23a-23b of the first structural layer 23.

The first, second and third portions 24a-24c of the second sacrificial layer 24 are desirably formed by etching a dielectric layer deposited beforehand on the first structural layer 23, the etching being selective with respect to the first structural layer 23. The deposition of the second sacrificial layer 24 can be conformal, in such a way that the first, second and third portions 24a-24c have the same thickness. Inversely, the deposition can be planarizing if it is followed by a mechanical-chemical polishing.

Figure 4C:
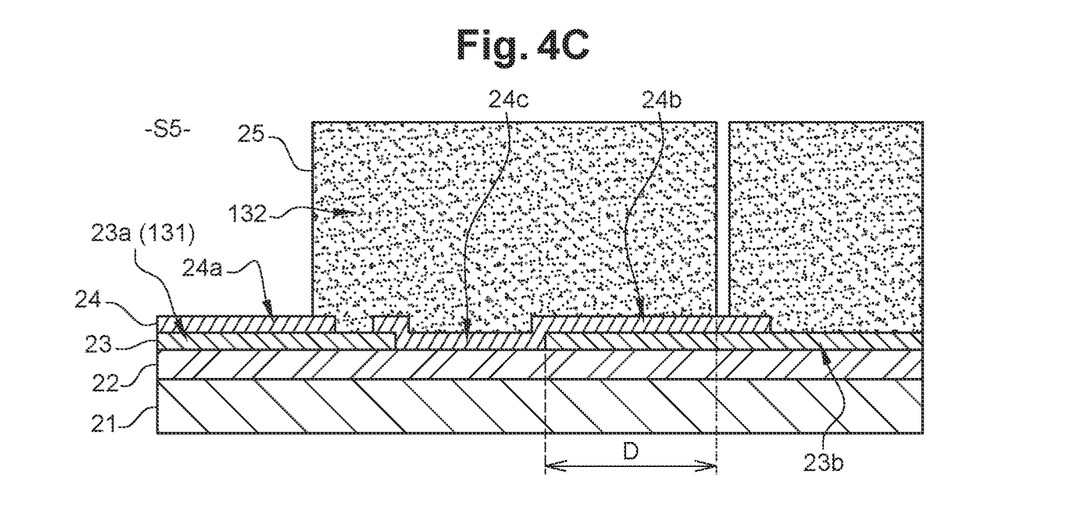
Figure 4D:
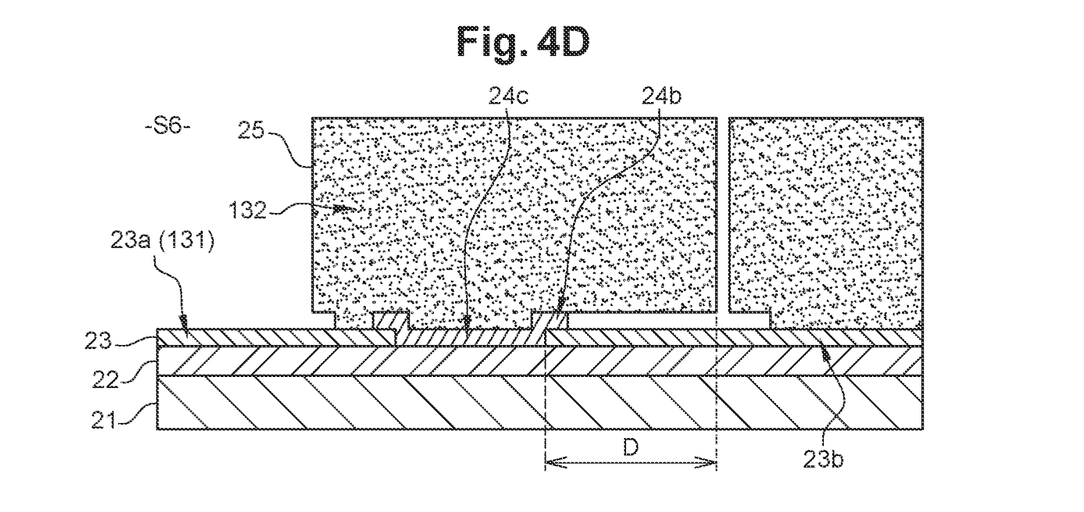

[FIG. 4C] In reference to FIG. 4C, the step S5 of etching the second structural layer 25 (in order to lighten the piston and delimit the rigidification structure 132) is accomplished in such a way that the trench corresponding to the periphery of the rigidification structure 132 opens onto the second portion 24b of the second sacrificial layer 24. The second portion 24b of the second sacrificial layer 24 is thus used as a stop layer to the etching. It prevents the first structural layer 23 from being etched and the first sacrificial layer 22 from being exposed (as in FIG. 2D).

In the following step S6 of etching the second sacrificial layer 24 (cf. [FIG. 4D]), the first portion 24a can thus be entirely removed without the first sacrificial layer 22 being altered. Indeed, the second portion 23b of the first structural layer 23 is intact and protects the first underlying sacrificial layer 22. Furthermore, the second portion 24b of the second sacrificial layer 24 is consumed during the removal of the first portion 24a. In other words, the second portion 24b has for effect to slow down the progression of the chemical species responsible for the etching, in such a way that they never reach the first sacrificial layer 22.

The manufacturing method then unfolds in the way described in relation with FIGS. 2F to 2H (steps S7-S9).

By thus separating the etching of the second structural layer 25 from the etching of the first structural layer 23 in the second region 32 of the stack, i.e. by decorrelating the trimming of the membrane 131 from the trimming of its rigidification structure 132, the first sacrificial layer 22 can be left intact. The step S8 of etching the substrate 21 (in order to delimit the first transmission arm 141) is then no longer a constraint, because the first sacrificial layer 22 fully fulfils its role of a stop layer.

The etching of the second structural layer 25 and the etching of the first structural layer 23 are desirable offset by a distance D comprised between 0.5 µm and 15 µm (cf. FIG. 4C).

The first portion 24a and the third portion 24c of the second sacrificial layer 24 are desirably spaced from one another, in such a way that the second structural layer 25 (rigidification structure 132) is directly in contact with the first portion 23a of the first structural layer 23 (membrane 131).

Figure 5:
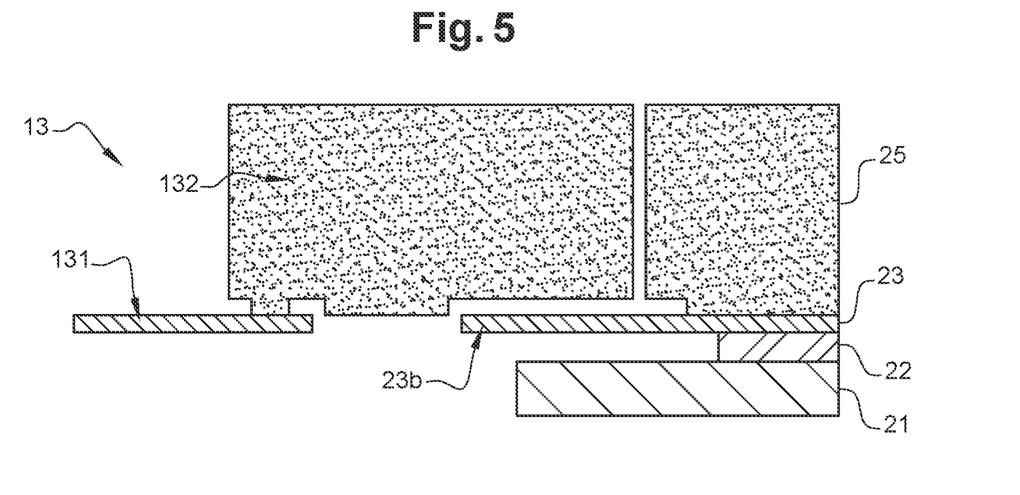
FIG. 5 is a cross-section view of the electroacoustic transducer, after the steps of FIGS. 4A-4D and 2F-2H have been accomplished, at the intersection between the periphery of the piston and the position of a first transmission arm.

FIG. 5 is a cross-section view of the structure obtained in the second region 32 after the step S9 of etching the first sacrificial layer 21 (second step of releasing the piston 13), when the steps S2-S3, S5-S6 of FIGS. 4A-4D have been accomplished.

The piston 13 is free to be displaced in relation to the frame, which here comprises residual portions of the substrate 21, of the first sacrificial layer 22 and of the second structural layer 25, as well as the second portion 23b of the first structural layer 23. The rigidification structure 132 overhangs the second portion 23b of the first structural layer 23. The distance between the rigidification structure 132 and the second portion 23b of the first structural layer 23 is equal to the thickness of the second portion 24b of the second sacrificial layer 24, typically comprised between 100 nm and 10 μm.

During the displacement of the piston 13, air is trapped between the rigidification structure 132 and this residual portion of the first structural layer 23. This trapping of air is at the origin of a damping phenomenon, called squeeze-film damping, which generates mechanical noise and results in a decrease in the performance of the transducer. The force of this damping phenomenon is inversely proportional to the cube of the distance between the piston 13 and the frame (here the second portion 23b of the first structural layer 23).

According to an embodiment of the manufacturing method, the etching of the second structural layer 25 making it possible to delimit the periphery of the rigidification structure 132 (step S5; FIG. 4C) is offset in relation to the etching of the first structural layer 23 (step S2; FIG. 4A) only in the second region 32 of the stack. Outside this second region 32 (i.e. for the rest of the periphery of the rigidification structure 132), for example in the first region 31 of the stack (cf. FIG. 3), the first structural layer 23 is etched (step S2) in such a way that the third portion 24c of the second sacrificial layer 24 (deposited in the step S3) extends at least to the periphery of the rigidification structure 132. Thus, there is no first structural layer 23 at the location where the substrate 21 and the rigidification structure 132 are superimposed. Outside the second region 32, the etching of the second structural layer 25 (step S5) opens onto the third portion 24c of the second sacrificial layer 24, which occupies the space left by etching of the first structural layer 23.

Figure 6:
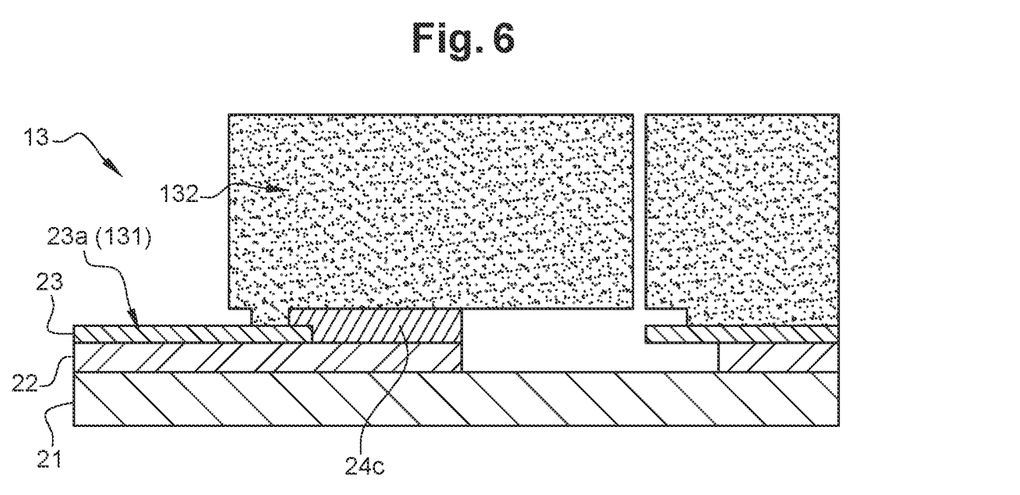
FIG. 6 is a cross-section view of the electroacoustic transducer, after the steps 4A-4D having been accomplished according to an embodiment of the manufacturing method, so as to decrease the damping phenomenon.

This embodiment is shown in FIG. 6. This figure shows as a schematical cross-section view the structure obtained after the first step of releasing the piston (etching of the second sacrificial layer 24) in a region of the periphery of the piston 13 other than the second region 32 (for example the first region 31 of FIG. 3).

The second portion 23b of the first structural layer 23 does not extend under the rigidification structure 132. The rigidification structure 132 is separated from the substrate 21 only by the first sacrificial layer 22 and by the second sacrificial layer 24 (and more particularly the third portion 24c occupying the space left by the etching of the first structural layer 23). After the second step of releasing the piston (step S9), the first sacrificial layer 22 and the second sacrificial layer 24 will have disappeared around the piston 13, forming a "gap" between the piston and the frame that is more important than in the second region 32 of the stack (cf. FIG. 5). This gap is for example two times more important when the two sacrificial layers 22 and 24 have identical thicknesses (which is in particular the case when they are used to produce the airgaps of the differential capacitive detection).

The damping phenomenon can thus be reduced while still resolving the problem of air leaks specific to the second region 32.

It can be also noted that outside the second region 32, the second sacrificial layer 24 does not necessarily comprise a second portion 24b disposed on the second portion 23b of the first structural layer 23.

In an alternative embodiment of the manufacturing method, the etching of the second structural layer 25 making it possible to offset the periphery of the rigidification structure 132 (step S5; FIG. 4C) is offset in relation to the etching of the first structural layer 23 (step S2; FIG. 4A) over the entire periphery of the rigidification structure 132.

In another alternative embodiment of the manufacturing method, the first structural layer 23 is left intact outside the second region 32 in the step S2, but etched in the step S5 at the same time as the second structural layer 25. In this case, the second sacrificial layer 24 does not comprise a second portion 24b or a third portion 24c. In other words, the manufacturing method is accomplished outside the second region 32 in the way described in relation with FIGS. 2A-2G (since the problem with leaks is specific to the second region 32).

FIGS. 7A, 7B, 7C and 7D show examples of masks (making it possible via photolithography to produce hard masks or made of resin on the stack of layers) used to respectively etch the first structural layer 23 (step S2), the first sacrificial layer 24 (step S3), the second structural layer 25 (step S5) and the substrate 21 (step S8), in the embodiment of the manufacturing method.

Figure 7A:
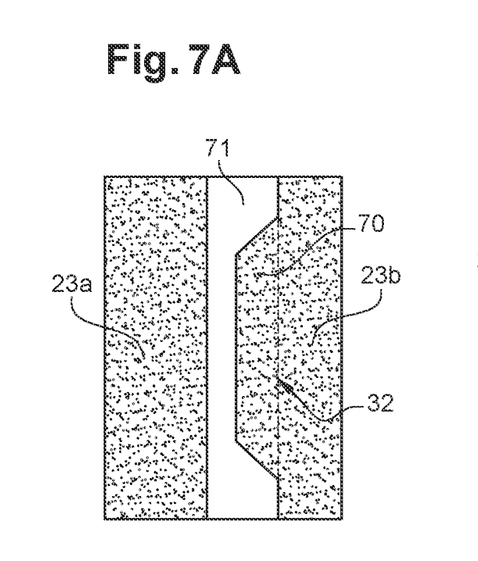
FIG. 7A to FIG. 7D show etching masks that can be used to accomplish the steps of FIGS. 4A, 4B, 4C and 2G.

[FIG. 7A] The mask of FIG. 7A comprises an opening (or recess) 71 to etch a portion of the first structural layer 23. On each side of the opening 71 there are solid portions of the mask that correspond to the first and second portions 23a-23b of the first structural layer 23. The opening 71 is configured in such a way that the second portion 23b of the first structural layer 23 forms an inset 70 (or protrusion) in the second region 32, the inset 70 being arranged facing the first portion 23a of the first structural layer 23. This inset 70, also called tab, is the means used here to offset (locally) the etching of the first structural layer 23 and the etching of the second structural layer 25. The inset 70 forms a local deviation of the opening 71.

Figure 7B:
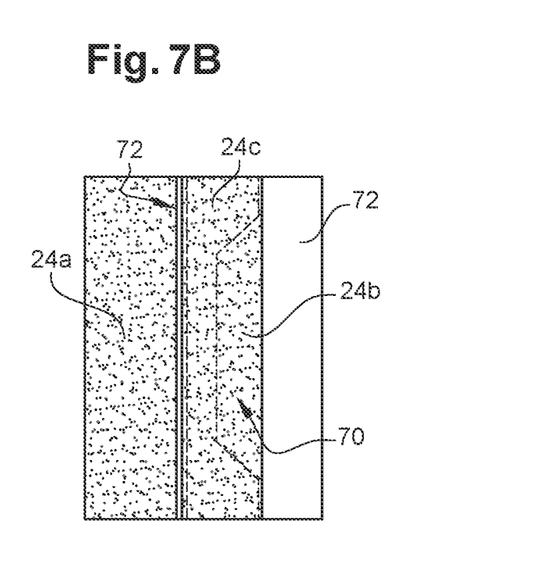

[FIG. 7B] The mask of the FIG. 7B comprises two openings 72 that allow for the etching of the second sacrificial layer 24. It shows (as a top view) the arrangement of the first portion 24a, the second portion 24b and the third portion 24c of the second sacrificial layer 24 in relation to the etched portion of the first structural layer 23 (now as a dotted line). It is observed that the second portion 24b indeed covers the tab 70.

Figure 7C:
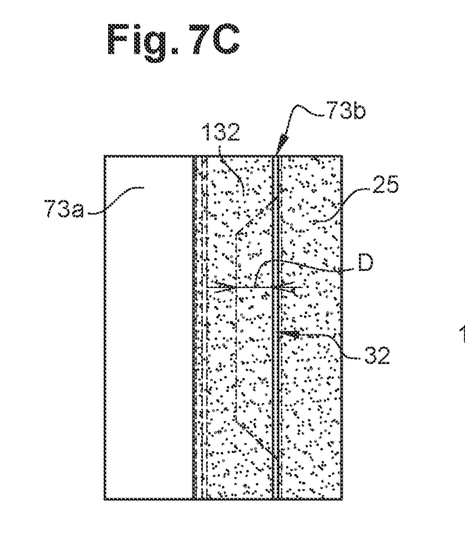

[FIG. 7C] The mask of FIG. 7C comprises two openings 73a-73b for simultaneously lightening the piston and delimiting the rigidification structure 132 in the second structural layer 25. In the second region 32, the opening 73b corresponding to the periphery of the rigidification structure 132 is offset (by the distance D) in relation to the opening 71 of the etching mask of the first structural layer 23. On the other hand, outside of the second region 32, the openings 73b and 71 are aligned one on the other (they can also be juxtaposed).

Figure 7D:
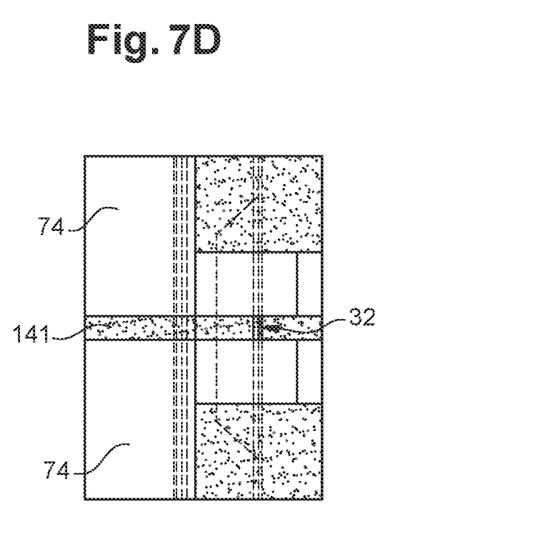

[FIG. 7D] The mask of FIG. 7D comprises two openings 74 (that communicate somewhere else) in order to delimit the first transmission arm 141 in the substrate. The first transmission arm 141 indeed passes through the periphery of the rigidification structure 132 (second region 32) at the tab 70.

Figure 8A:
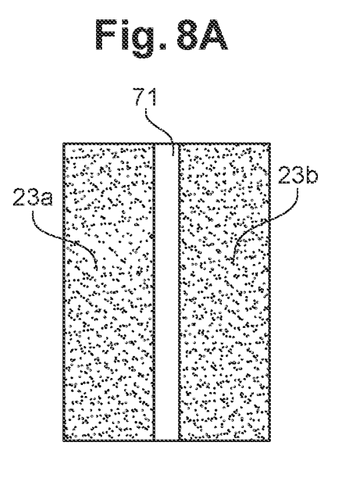
FIG. 8A to FIG. 8C show other etching masks that can be used to accomplish the steps of FIGS. 4A, 4B, 4C.
Figure 8B:
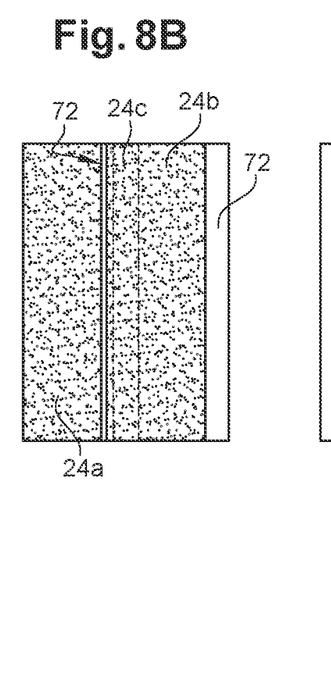
Figure 8C:
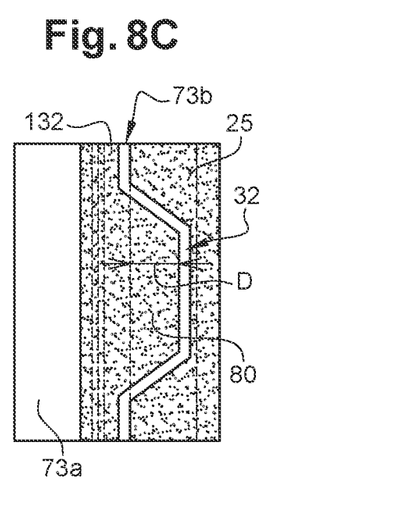

In an alternative embodiment of the manufacturing method shown in FIGS. 8A-8C, the etching between the first structural layer 23 and the etching of the second structural layer 25 are separated from one another by means of an inset 80 of the rigidification structure 132, rather than the inset 70 of the second portion 23b of the first structural layer 23. The inset 80 of the rigidification structure 132 faces the remaining portion of the second structural layer 25. The inset 80 forms here a local deviation of the opening 73b.

FIGS. 8A, 8B and 8C show masks that can be used to respectively etch the first structural layer 23 (step S2), the first sacrificial layer 24 (step S3) and the second structural layer 25 (step S5) according to this alternative embodiment. As the etching of the substrate 21 (step S8) is not impacted, the mask of FIG. 7D can again be used.

The opening 71 of the mask used to etch the first structural layer 23 and shown in FIG. 8A is beneficially rectilinear.

[FIG. 8B] The second portion 24b of the second sacrificial layer 24, shown by a solid portion of the mask of FIG. 8B, can be wider than in the embodiment of FIGS. 7A-7D (according to the distance D desired).

[FIG. 8C] Finally, as shown in FIG. 8C, the opening 73b of the etching mask of the second structural layer 25 is configured to form the inset 80 (or protrusion) of the rigidification structure 132.

Figure 9:
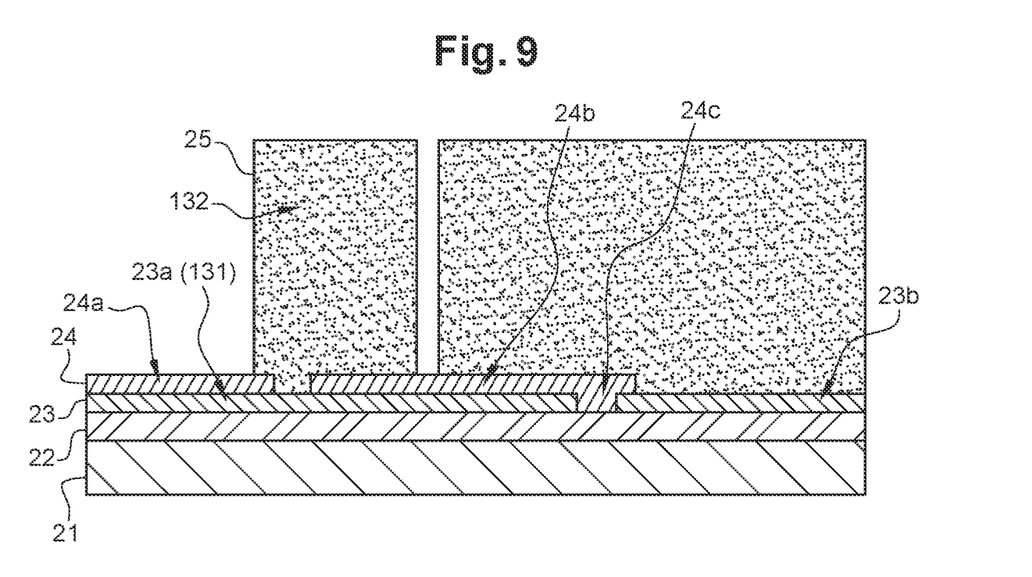
FIG. 9 shows an alternative embodiment of the manufacturing method according to the invention.

In an embodiment shown in FIG. 9, the etching of the structural layer 25 can be offset in relation to the etching of the first structural layer 23 (by means of an inset of the first structural layer 23 or by means of an inset of the second structural layer 25) on the side of the piston 13, rather than on the side of the frame. The second portion 24b of the second sacrificial layer 24, whereon the etching of the second structural layer 25 is stopped, is then arranged on the first portion 23a of the first structural layer 23. The membrane 131 of the piston 13 then extends beyond the rigidification structure 132 in the second region 32.

The method for manufacturing an electroacoustic transducer according to the invention was described by taking as an example a capacitive detection microphone (FIG. 1), of which one face is subjected to atmospheric pressure and the other face subjected to a reference pressure. The manufacturing method described with respect to FIGS. 2A-2H and 4A-4D, is however applicable to other types of microphones and to other types of electroacoustic transducers, in particular a loudspeaker (sound emitter) or an ultrasound emitter.

More generally, a microphone comprises in the second zone 12 (chamber with a controlled atmosphere) a device for measuring a movement of the transmitting device and/or a force applied to the transmitting device. This measuring device comprises for example a vibrating beam (resonant detection microphone).

In the case of a loudspeaker or of an ultrasound emitter, an actuator (for example capacitive) replaces the measuring means in the second zone 22. The actuator sets into motion the first end of the second transmission arm 142. This movement is transmitted by the transmitting device 14 to the piston 13 integral with the first end of the first transmission arm 141. The movement of the membrane 131 of the piston 13 makes it possible to emit a sound (or ultrasounds).

The invention claimed is:

1. A method for manufacturing an electroacoustic transducer comprising:
    a frame;
    an element movable with respect to the frame, the movable element comprising a membrane and a rigification structure for rigidifying the membrane;
    a first transmission arm, the movable element being coupled to an end of the first transmission arm;
    the method comprising:
    providing a stack comprising successively a substrate, a first sacrificial layer and a first structural layer;
    etching the first structural layer to the first sacrificial layer in such a way as to separate a first portion of the first structural layer and a second portion of the first structural layer, the first portion of the first structural layer being intended to form the membrane of the movable element; forming a second sacrificial layer comprising:
    a first portion arranged on the first portion of the first structural layer;
    a second portion spaced from the first portion and arranged on the first structural layer; and
    a third portion adjacent to the second portion and arranged on the first sacrificial layer between the first and second portions of the first structural layer;
    forming a second structural layer on the second sacrificial layer;
    etching the second structural layer in such a way as to delimit the rigidification structure of the movable element and in such a way as to expose the first portion of the second sacrificial layer;
    etching the second sacrificial layer in such a way as to expose the first portion of the first structural layer;
    wherein the etching of the first structural layer and the etching of the second structural layer delimiting the periphery of the rigidification structure are spaced from one another in a region around the position of the first transmission arm, in such a way that the second portion of the second sacrificial layer serves as a stop layer to the etching of the second structural layer.

2. The method according to claim 1, wherein the first structural layer is etched outside said region in such a way that the third portion of the second sacrificial layer extends at least to the periphery of the rigidification structure.

3. The method according to claim 1, wherein the etching of the first structural layer and the etching of the second structural layer are spaced from one another by means of an inset of the first structural layer.

4. The method according to claim 1, wherein the etching of the first structural layer and the etching of the second structural layer are spaced from one another by means of an inset of the second structural layer.

5. The method according to claim 1, wherein the second portion of the second sacrificial layer is arranged on the second portion of the first structural layer.

6. The method according to claim 1, wherein the second portion of the second sacrificial layer is arranged on the first portion of the first structural layer.

7. The method according to claim 1, further comprising, after etching the second sacrificial layer:
    etching the substrate to the first sacrificial layer in such a way as to delimit the first transmission arm; and
    etching the first sacrificial layer in such a way as to render moveable the first portion of the first structural layer.

8. The method according to claim 7, further comprising, after etching the second sacrificial layer and before etching the substrate:
arranging a cover on the second structural layer, thus forming an assembly; and
turning over the assembly.

9. The method according to claim 1, wherein the stack is a multilayer structure of the silicon-on-insulator (SOI) type.

10. The method according to claim 1, wherein the substrate is made from silicon, the first sacrificial layer is made from silicon oxide and the first structural layer is made from silicon.

11. The method according to claim 1, wherein the second sacrificial layer is made from silicon oxide.

12. The method according to claim 1, wherein the first structural layer has a thickness comprised between 100 nm and 10 μm.

* * * * *